United States Patent
Naono

(10) Patent No.: US 8,672,457 B2
(45) Date of Patent: Mar. 18, 2014

(54) PIEZOELECTRIC FILM AND METHOD OF MANUFACTURING SAME, PIEZOELECTRIC DEVICE AND LIQUID EJECTION APPARATUS

(75) Inventor: Takayuki Naono, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 55 days.

(21) Appl. No.: 13/206,805

(22) Filed: Aug. 10, 2011

(65) Prior Publication Data

US 2012/0038713 A1   Feb. 16, 2012

(30) Foreign Application Priority Data

Aug. 11, 2010 (JP) ................... 2010-180448

(51) Int. Cl.
*B41J 2/045* (2006.01)
(52) U.S. Cl.
USPC ............... 347/68; 347/70; 347/71; 310/358; 252/62.9 PZ

(58) Field of Classification Search
USPC ............... 347/68–72; 310/358; 252/62.9 PZ, 252/62.9 R
See application file for complete search history.

(56) References Cited

U.S. PATENT DOCUMENTS 5,719,607 A * 2/1998 Hasegawa et al. ............ 347/70
2009/0057135 A1* 3/2009 Fujii et al. ................ 204/192.13

FOREIGN PATENT DOCUMENTS

JP       2005-333088 A    12/2005

* cited by examiner

*Primary Examiner* — Henok Legesse
(74) *Attorney, Agent, or Firm* — Birch, Stewart, Kolasch & Birch, LLP

(57) ABSTRACT

A piezoelectric film is constituted of a perovskite oxide represented as: $Pb_{1+\delta}(Zr_xTi_y)_{1-a}(Mg_bNb_{1-b})_aO_z$, where $\delta$ and $z$ are values within ranges where a perovskite structure is obtained and $\delta=0$ and $z=3$ are standard, Pb is replaceable with another A site element in an amount of a range where the perovskite structure is obtained, b is a value in a range of $0.090 \leq b \leq 0.25$, and a Nb ratio at a B site satisfies $0.13 \leq a \times (1-b)$.

10 Claims, 6 Drawing Sheets

FIG.5

| | TARGET | Nb COMPONENT (%) | Mg COMPONENT (%) | b | CRACK | Ra (nm) | STRESS (MPa) | $d_{31}$ (pm/V) |
|---|---|---|---|---|---|---|---|---|
| COMPARATIVE EXAMPLE1 | $Pb_{1.3}(Zr_{0.46}Ti_{0.43}Nb_{0.07}Mg_{0.04})O_3$ | 6.8 | 4.1 | 0.38 | C | 11 | 190 | 74 |
| COMPARATIVE EXAMPLE2 | $Pb_{1.3}(Zr_{0.47}Ti_{0.44}Nb_{0.07}Mg_{0.02})O_3$ | 6.8 | 1.3 | 0.16 | A | 10 | 160 | 110 |
| COMPARATIVE EXAMPLE3 | $Pb_{1.3}(Zr_{0.48}Ti_{0.45}Nb_{0.07})O_3$ | 6.8 | 0 | 0 | A | 10 | 150 | 146 |
| COMPARATIVE EXAMPLE4 | $Pb_{1.3}(Zr_{0.42}Ti_{0.39}Nb_{0.12}Mg_{0.07})O_3$ | 13 | 6.5 | 0.33 | B | 11 | 180 | 140 |
| PRACTICAL EXAMPLE1 | $Pb_{1.3}(Zr_{0.44}Ti_{0.40}Nb_{0.12}Mg_{0.04})O_3$ | 13 | 3.5 | 0.21 | A | 9 | 170 | 195 |
| COMPARATIVE EXAMPLE5 | $Pb_{1.3}(Zr_{0.46}Ti_{0.42}Nb_{0.12})O_3$ | 13 | 0 | 0 | A | 12 | 150 | 210 |
| PRACTICAL EXAMPLE2 | $Pb_{1.3}(Zr_{0.42}Ti_{0.38}Nb_{0.16}Mg_{0.04})O_3$ | 16 | 3.5 | 0.18 | A | 9 | 143 | 203 |
| COMPARATIVE EXAMPLE6 | $Pb_{1.3}(Zr_{0.44}Ti_{0.40}Nb_{0.16})O_3$ | 16 | 0 | 0 | A | 18 | 133 | 220 |
| COMPARATIVE EXAMPLE7 | $Pb_{1.3}(Zr_{0.35}Ti_{0.33}Nb_{0.21}Mg_{0.11})O_3$ | 22 | 10 | 0.31 | C | 8 | 180 | NOT MEASURABLE |
| PRACTICAL EXAMPLE3 | $Pb_{1.3}(Zr_{0.37}Ti_{0.34}Nb_{0.21}Mg_{0.08})O_3$ | 22 | 7 | 0.24 | A | 7 | 140 | 216 |
| PRACTICAL EXAMPLE4 | $Pb_{1.3}(Zr_{0.38}Ti_{0.36}Nb_{0.21}Mg_{0.05})O_3$ | 22 | 4 | 0.15 | A | 10 | 90 | 228 |
| PRACTICAL EXAMPLE5 | $Pb_{1.3}(Zr_{0.40}Ti_{0.36}Nb_{0.21}Mg_{0.03})O_3$ | 22 | 2.3 | 0.095 | A | 17 | 70 | 240 |
| COMPARATIVE EXAMPLE8 | $Pb_{1.3}(Zr_{0.42}Ti_{0.37}Nb_{0.21})O_3$ | 22 | 0 | 0 | B | 30 | 60 | 250 |

PIEZOELECTRIC FILM AND METHOD OF MANUFACTURING SAME, PIEZOELECTRIC DEVICE AND LIQUID EJECTION APPARATUS

BACKGROUND OF THE INVENTION

1. Field of the Invention

The present invention relates to a piezoelectric film and a method of manufacturing same, and to a piezoelectric device and a liquid ejection apparatus, and more particularly to a piezoelectric film having improved piezoelectric performance and improved surface morphology and a method of manufacturing such a piezoelectric film, and to a piezoelectric device and a liquid ejection apparatus.

2. Description of the Related Art

A piezoelectric device which includes a piezoelectric body having piezoelectric characteristics whereby the body expands and contracts with increase and decrease in the intensity of an applied electric field, and electrodes through which the electric field is applied to the piezoelectric body, are used in applications such as piezoelectric actuators mounted in inkjet type recording heads. A perovskite type oxide, such as lead zirconate titanate (PZT), is used widely as piezoelectric material. The piezoelectric material is ferroelectric and possesses a spontaneous electric polarization when no electric field is applied.

It has been known since the 1960s that PZT that is doped with various donor ions having higher valence than the valence of the substituted ions has improved properties, such as ferroelectric characteristics, compared to pure PZT. $V^{5+}$, $Nb^{5+}$, $Ta^{5+}$, $Sb^{5+}$, $Mo^{6+}$, $Mg^{2+}$, $W^{6+}$, and the like, are known as donor ions which substitute for $Zr^{4+}$ and/or $Ti^{4+}$ at the B site.

For example, Japanese Patent Application Publication No. 2005-333088 discloses a piezoelectric film in which, in order to provide a piezoelectric device having a high piezoelectric constant, at least one element of Zn, Ni, Mn and Mg, and at least one element of Nb and Ta are respectively combined at the B site in a ratio of 1:2.

However, a relaxor-type PZT, typically PMN-PZT having Mg and Nb for substitution at the B site, such as that described in Japanese Patent Application Publication No. 2005-333088, displays higher piezoelectric performance than normal PZT in bulk form, but does not yield high piezoelectric performance in the form of a thin film. Furthermore, when the relaxor-type PZT is formed as a thin film, there has been a problem in that the surface characteristics of the film are poor.

SUMMARY OF THE INVENTION

The present invention has been contrived in view of these circumstances, an object thereof being to provide a piezoelectric film having high piezoelectric performance and good surface morphology, and a method of manufacturing same, and a piezoelectric device and liquid ejection apparatus.

In order to attain the aforementioned object, the present invention is directed to a piezoelectric film constituted of a perovskite oxide represented as: $Pb_{1+\delta}(Zr_xTi_y)_{1-a}(Mg_b Nb_{1-b})_aO_z$, where $\delta$ and z are values within ranges where a perovskite structure is obtained and $\delta=0$ and $z=3$ are standard, Pb is replaceable with another A site element in an amount of a range where the perovskite structure is obtained, b is a value in a range of $0.090 \leq b \leq 0.25$, and a Nb ratio at a B site satisfies $0.13 \leq a \times (1-b)$.

According to this aspect of the present invention, since the doping amount of Mg is in the range of $0.090 \leq b \leq 0.25$, then it is possible to improve the surface morphology without a significant reduction in the piezoelectric performance. Although the piezoelectric performance can be improved by doping with Nb, the doping with Nb alone is not desirable from the viewpoint of charge neutrality, and reduction in surface properties of the piezoelectric film is observed. This can be improved by doping with Mg, but in the related art, Mg and Nb are added at a ratio of Mg:Nb=1:2, from the viewpoint of charge compensation. However, it has been discovered that only Nb contributes to the piezoelectric performance, whereas Mg is an auxiliary agent for maintaining crystalline properties, and in the present invention, a suitable amount of Mg has been specified. By setting the amount of Mg to be smaller than ½ of the amount of Nb, and to the range of $0.090 \leq b \leq 0.25$, it is possible to improve the surface morphology of the piezoelectric film.

Moreover, by setting the ratio of the amount of Nb at the B site to be not less than 0.13, it is possible to improve the piezoelectric performance, and the degraded surface smoothness caused by doping with Nb can be improved by doping with Mg. There is a decline in the piezoelectric characteristics caused by doping with Mg, but since doping with Nb substantially improves the piezoelectric characteristics, it is possible to maintain the piezoelectric characteristics within the acceptable range.

Furthermore, if the amount of Nb is a small amount of approximately 1% to 2%, for example, then it is possible to achieve a perovskite structure even with a composition of Mg:Nb=1:2, but if the doping amount of Nb is increased to not less than 13% as in the present invention, then a perovskite structure cannot be achieved with the amount of Mg in the related art. In the present invention, it is possible to obtain a perovskite structure by setting a suitable amount of Mg even when the doping amount of Nb is increased to not less than 13%.

Preferably, the Nb ratio at the B site satisfies $0.16 \leq a \times (1-b)$.

According to this aspect of the present invention, since the Nb ratio at the B site is not less than 0.16, then it is possible to improve the piezoelectric performance further, and it is also possible to improve the effects of improving the surface morphology by means of Mg.

Preferably, a ratio x:y between Zr and Ti at the B site is in a range of 45:55 to 55:45.

According to this aspect of the present invention, by setting the ratio of Zr and Ti to the range described above, it is possible to achieve a composition close to the MPB (morphotropic phase boundary) which is the phase transition point between a tetragonal crystal phase and a rhombohedral crystal phase, and therefore high piezoelectric performance can be achieved.

Preferably, the piezoelectric film is formed by a vapor phase deposition method, and more preferably, the vapor phase deposition method is a sputtering method.

According to these aspects of the present invention, since the piezoelectric film is formed by the vapor phase deposition method, and more preferably, by sputtering, then it is possible to prevent the occurrence of lateral stripes caused by layered crystallization, and durability can be improved. In a state where charge neutrality is not established, it has been difficult to achieve a perovskite structure with a method which uses a state of equilibrium, such as bulk sintering, but by forming the piezoelectric body as a thin film by a sputtering method in which a film is formed in state of non-equilibrium, it is possible to achieve a perovskite structure even if charge neutrality is not established.

In order to attain the aforementioned object, the present invention is also directed to a piezoelectric device, comprising: the above-described piezoelectric film; electrodes through which an electric field is applied to the piezoelectric film; and a substrate on which the piezoelectric film and the electrodes are arranged, the substrate being one of a silicon substrate, a silicon oxide substrate and an SOI substrate.

In order to attain the aforementioned object, the present invention is also directed to a liquid ejection apparatus, comprising: the above-described piezoelectric device; and a liquid ejection member which is arranged integrally with or separately from the piezoelectric device, wherein the liquid ejection member includes a liquid storage chamber in which liquid is stored, and a liquid ejection port through which the liquid is ejected externally from the liquid storage chamber.

The piezoelectric film according to the present invention has high piezoelectric performance and can improve the surface morphology, and therefore is suitable for use in the piezoelectric device and the liquid ejection apparatus.

In order to attain the aforementioned object, the present invention is also directed to a method of manufacturing the above-described piezoelectric film, the method comprising the step of performing formation of the piezoelectric film by a vapor phase deposition method.

Preferably, the vapor phase deposition method is a sputtering method.

According to these aspects of the present invention, since the piezoelectric film is formed by the vapor phase deposition method, and more preferably, by sputtering, then it is possible to prevent the occurrence of lateral stripes caused by layered crystallization, and durability can be improved.

Preferably, the method further comprises the step of: arranging a substrate and a target separately from each other, the target having a composition corresponding to a composition of the piezoelectric film to be formed on the substrate, wherein in the step of performing formation of the piezoelectric film, a film formation temperature Ts (° C.), and a potential difference Vs−Vf (V) between a plasma potential Vs (V) and a floating potential Vf (V) in a plasma during the formation of the piezoelectric film satisfy: Ts≥400; and −0.2Ts+100<Vs−Vf<−0.2Ts+130.

According to this aspect of the present invention, it is possible to manufacture the piezoelectric film having the high piezoelectric constant.

According to the piezoelectric film of the present invention, it is possible to improve the piezoelectric performance by doping with Nb and it is possible to improve the surface morphology by optimizing the amount of Mg. Furthermore, the piezoelectric film of the present invention is suitable for use in a piezoelectric device and a liquid ejection apparatus.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 5 is a table showing the conditions and the results in Examples; and

DETAILED DESCRIPTION OF THE PREFERRED EMBODIMENTS

Piezoelectric Film

Figure 1:
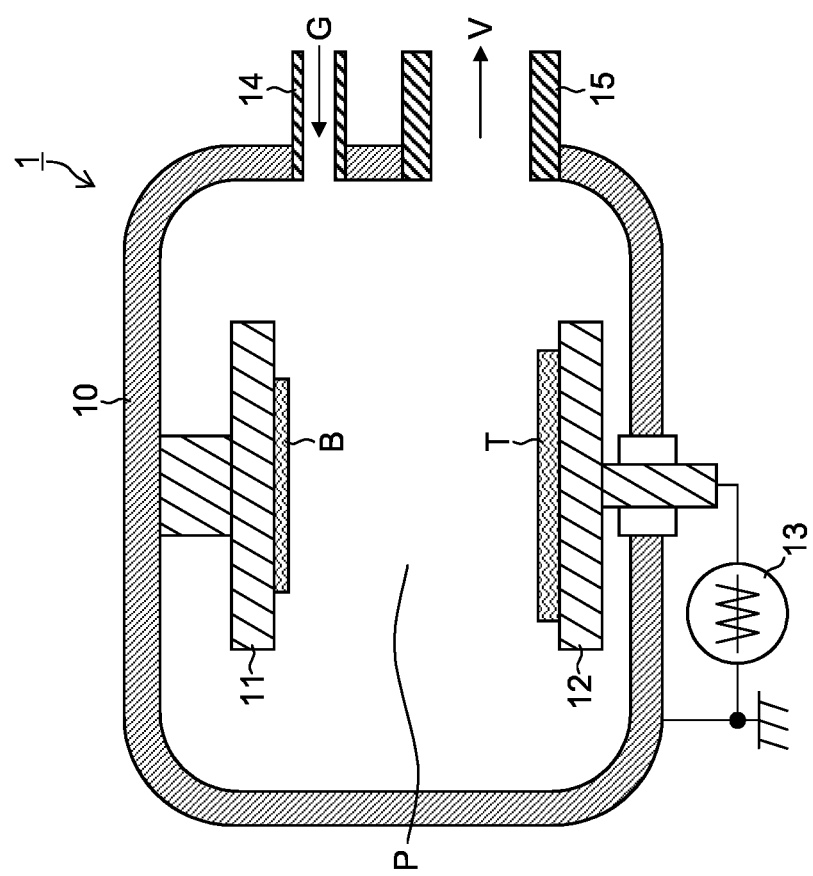
FIG. 1 is a schematic cross-sectional diagram of a sputtering apparatus.

A piezoelectric film according to an embodiment of the present invention is mainly composed of a perovskite oxide represented by the following general formula (P):

$$Pb_{1+\delta}(Zr_xTi_y)_{1-a}(Mg_bNb_{1-b})_aO_z, \qquad (P)$$

where δ and z can be values within ranges where a perovskite structure is obtained, and it is preferable that δ=0 and z=3.

The value of b in the perovskite oxide (P) satisfies 0.090≤b≤0.25. The Nb doping amount at the B site, i.e., a×(1−b), is not less than 0.13.

Moreover, by doping with donor ions substituting at the A site as shown in the following formula (P'), the amount of Pb can be reduced, the drive durability can be thereby improved, and since the Pb loss can be complemented, it is possible to form a film of perovskite type oxide, and the piezoelectric performance can be improved:

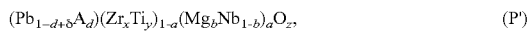

$$(Pb_{1-d+\delta}A_d)(Zr_xTi_y)_{1-a}(Mg_bNb_{1-b})_aO_z, \qquad (P')$$

where A is an A-site dopant, which can be at least one element selected from a group consisting of Ba, La, Sr, Bi, Li, Na, Ca, Cd, Mg and K. There are no particular limits on the amount d of the A-site dopant A, provided that d is within a range where a perovskite structure is obtained.

It is said that the PZT type perovskite oxide displays high piezoelectric performance at the morphotropic phase boundary (MPB) and the vicinity thereof. In the PZT material, if the material is Zr-rich, then the material assumes a rhombohedral structure and if the material is Ti-rich, then the material assumes a tetragonal structure; the boundary between the rhombohedral structure and the tetragonal structure, in other words, the MPB, is in the vicinity of the molar ratio of Zr/Ti=55/45. Consequently, it is desirable that the value y in the above-described general formula (P) coincides with the MPB composition or the vicinity thereof. More specifically, it is desirable that x:y is within a range of 45:55 to 55:45.

The amount of Nb at the B site is not less than 0.13, and more desirably, not less than 0.16. By setting the amount of Nb to the range described above, it is possible to improve the piezoelectric performance. Furthermore, desirably, the upper limit of the amount of Nb is not more than 0.4. If the amount of Nb is large, then it is possible to improve the piezoelectric performance, but if the amount of Nb is too large, it is conversely undesirable because it becomes impossible to form a perovskite structure, and a pyrochlore structure, which has no piezoelectric characteristics, appears instead.

In the embodiment of the present invention, Nb and Mg are added as substitution at the B site, the doping amount of Nb is large, and the composition ratio between Nb and Mg is different from those in the related art. By doping with Nb, it is possible to improve the piezoelectric performance, but the surface morphology of the thin film thus formed declines. Then, in the related art, Mg has been added at a composition ratio of Mg:Nb=1:2, from the viewpoint of matching valence. According to the embodiment of the present invention, it is clear that only Nb contributes to the piezoelectric performance and Mg is the additive agent for maintaining the crystalline properties. Furthermore, according to the embodiment of the present invention, the suitable amount of Mg in the case of a thin film is less than ½ the amount of Nb, and in the general formula (P) described above, the range of b is 0.090≤b≤0.25, and desirably, 0.15≤b≤0.25. Thereby, it is possible to improve the surface morphology, and it is thus possible to achieve a high voltage tolerance.

Method of Manufacturing Piezoelectric Film

A piezoelectric film of which the main component is a perovskite oxide represented by the above-described general formula (P) can be formed by a thermal non-equilibrium process. Possible examples of a suitable method for forming the piezoelectric film according to the present embodiment include vapor phase deposition methods, such as: sputtering, plasma CVD, MOCVD, calcination and quenching, annealing and quenching, spraying and quenching, and the like. Of these sputtering is especially desirable.

In the thermal equilibrium process, such as sol gelation, high-concentration doping of a dopant that does not have matching valence is essentially difficult, and requires expedients such as using a sintering additive or acceptor ions, or the like. In contrast, with the thermal non-equilibrium process, it is possible to achieve high-concentration doping of donor ions without such expedients.

Furthermore, in the thermal non-equilibrium process, it is possible to form the piezoelectric film at a relatively low film formation temperature that is lower than the temperature at which Si and Pb react with each other, and therefore it is possible to form the piezoelectric film on a Si substrate having good processability, which is desirable.

In the sputtering process, factors which govern the characteristics of the formed film include: the film formation temperature, the type of substrate, the under layer composition if there is a film that has been deposited previously on the substrate, the surface energy of the substrate, the film formation pressure, the volume of oxygen in the atmospheric gas, the input power, the substrate-to-target distance, the electron temperature and electron density in the plasma, the active species density and active species lifespan in the plasma, and so on.

For example, it is possible to form a film of good quality by optimizing the film formation temperature Ts and any one of the plasma potential Vs in the plasma during the film formation, the potential difference Vs–Vf between the plasma potential Vs and the floating potential Vf, and the substrate-to-target distance D. More specifically, if the characteristics of the film are plotted on a rectangular coordinate graph where the film formation temperature Ts is on the horizontal axis and any one of Vs, Vs–Vf, and the substrate-to-target distance D is on the vertical axis, then a film of good quality can be formed in a particular range on the graph.

Referring to FIG. 1, a composition of a sputtering apparatus and aspects of film formation according to an embodiment of the present invention are described. Here, an RF (radio frequency) sputtering apparatus employing an RF power supply is described by way of an example; however, it is also possible to use a DC sputtering apparatus employing a DC power supply. FIG. 1 is a schematic cross-sectional diagram of the whole apparatus.

As shown in FIG. 1, the sputtering apparatus 1 includes a vacuum vessel 10, in which a substrate holder 11 and a plasma electrode (cathode electrode) 12 are arranged. The substrate holder 11 can be an electrostatic chuck, for example, and can hold the film formation substrate B and heat the film formation substrate B to a prescribed temperature. The plasma electrode can generate a plasma.

The substrate holder 11 and the plasma electrode 12 are separately disposed to face each other, and a target T is loaded onto the plasma electrode 12. The plasma electrode 12 is connected to an RF power supply 13.

The vacuum vessel 10 is provided with a gas introduction tube 14, through which a gas G required for film formation is introduced into the vacuum vessel 10, and a gas discharge tube 15, through which a gas V inside the vacuum vessel 10 is discharged. For the gas G, it is possible to use Ar, a mixed gas of Ar/$O_2$, or the like.

When forming the piezoelectric film according to the present embodiment by sputtering, it is preferable that the film formation is carried out under film formation conditions where the film formation temperature Ts (° C.) and the potential difference Vs–Vf (V) between the plasma potential Vs (V) in the plasma during the film formation and the floating potential Vf (V) satisfy the following Formulas (1) and (2), and more preferably satisfy the following Formulas (1), (2) and (3):

$$Ts \geq 400; \tag{1}$$

$$-0.2Ts+100 < Vs-Vf < -0.2Ts+130; \text{ and} \tag{2}$$

$$10 \leq Vs-Vf \leq 35. \tag{3}$$

The potential of the plasma space P is the plasma potential Vs (V). Normally, the substrate B is an insulator and is electrically insulated from the ground. Consequently, the substrate B is in a floating state and the potential thereof is the floating potential Vf (V). It is thought that atoms sputtered from the target T and moving toward the substrate B during the film formation impinge on the substrate B with the kinetic energy corresponding to the acceleration voltage of the potential difference Vs–Vf between the potential of the plasma space P and the potential of the substrate B.

Figure 2:
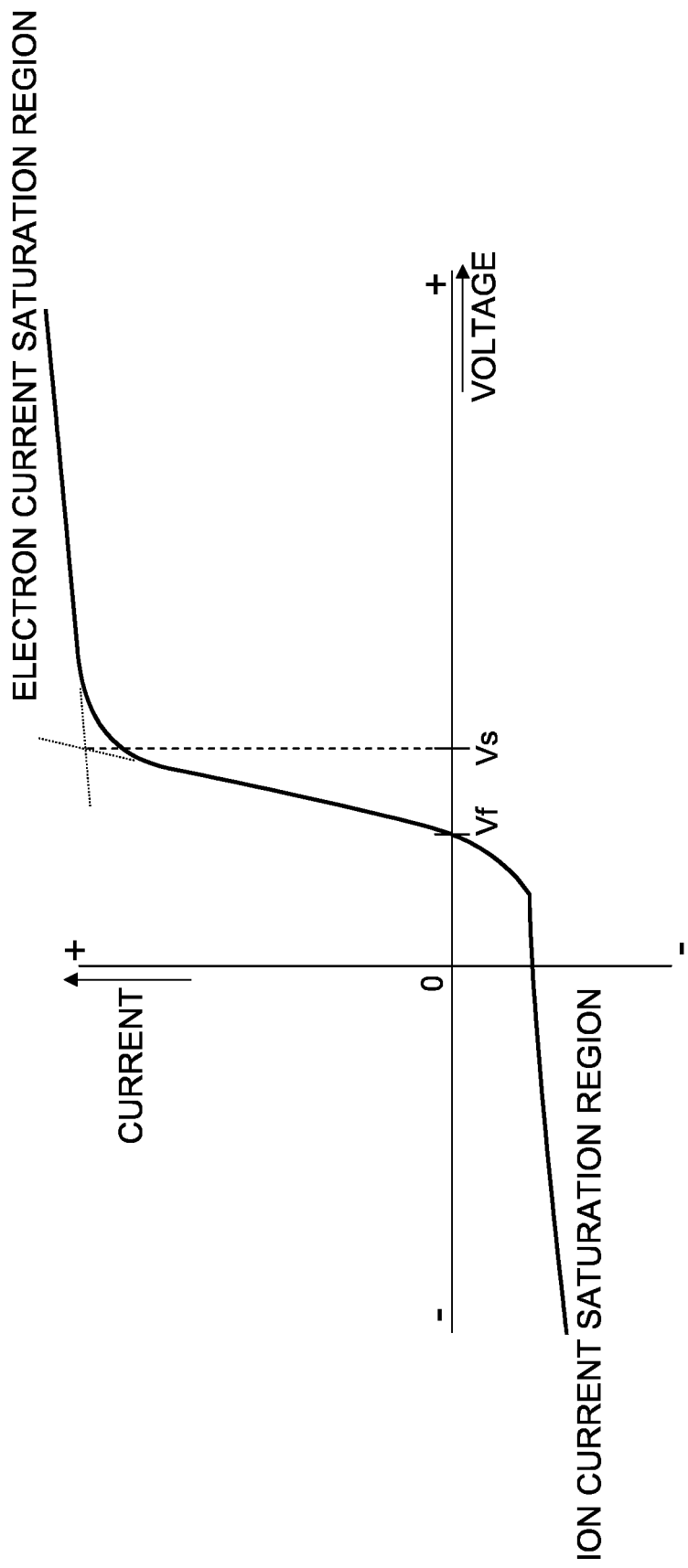
FIG. 2 is an illustrative diagram for describing a method of measuring the plasma potential Vs and the floating potential Vf.

The plasma potential Vs and the floating potential Vf can be measured through a Langmuir probe. When the tip of the Langmuir probe is inserted into the plasma space P and the voltage applied to the probe is altered, voltage-current characteristics such as those shown in FIG. 2, for example, are obtained (see "Purazuma To Seimaku No Kiso (The Essentials of Plasmas and Film Formation)", p. 90, Mitsuharu Konuma, published by Nikkan Kogyo Shimbunsha, Japan). In FIG. 2, the probe potential at which the current becomes 0 is the floating potential Vf. This is the state where the ion current flowing to the probe surface and the electronic current flowing to the probe surface become equal. The surface of metal that is in the insulated state and the surface of the substrate assume the floating potential Vf. When the voltage applied to the probe is raised above the floating potential Vf, the ion current gradually decreases, and only the electronic current reaches the probe when the voltage applied to the probe is above a boundary voltage, which is taken as the plasma potential Vs. The potential difference Vs–Vf can be changed, for instance, by placing the ground between the substrate and the target.

It is known that, in film formation of a PZT type piezoelectric film by sputtering, loss of Pb becomes liable to occur if the film formation is carried out at high temperature. The loss of Pb also depends on the potential difference Vs–Vf, as well as the film formation temperature. Pb has the greatest sputtering rate among the constituent elements of PZT, namely, Pb, Zr and Ti, and is then most readily sputtered. For example, Table 8.1.7 in "Shinkuu Handobukku (Vacuum Handbook)" (edited by Ulvac Inc., published by Ohmsha, Japan) shows the following sputtering rates under conditions of Ar ions at 300 eV: Pb=0.75, Zr=0.48, Ti=0.65. If a material is readily sputtered, then this means that, after atoms sputtered from the target have become deposited on the substrate surface, they can readily be sputtered again (re-sputtered) from the substrate surface. The greater the difference between the plasma potential and the substrate potential, in other words, the greater the potential difference Vs–Vf, then the greater the re-sputtering rate, and the more likely it becomes that Pb loss will occur.

Under conditions where the film formation temperature Ts is too low and the potential difference Vs–Vf is too small, it tends to be impossible to satisfactorily grow perovskite crystals. On the other hand, under conditions where the film formation temperature Ts is too high and/or the potential difference Vs–Vf is too large, Pb loss tends to become more likely to occur. In other words, under conditions where Ts≥400° C. which satisfies the above-described Formula (1), if the film formation temperature Ts is relatively low, then it is necessary to relatively raise the potential difference Vs–Vf in order to satisfactorily grow perovskite crystals, and if the film formation temperature Ts is relatively high, then it is necessary to relatively lower the potential difference Vs–Vf in order to suppress loss of Pb. This is expressed in the above-described Formula (2).

Furthermore, when forming a PZT piezoelectric film, a piezoelectric film having a high piezoelectric constant is obtained by specifying the film formation conditions in a range which satisfies the above-described Formulas (1), (2) and (3).

By using the vapor phase deposition method, and in particular, the sputtering method, it is possible to form the film having a columnar crystal film structure constituted of columnar crystals. By forming a columnar crystal film structure constituted of columnar crystals which extend non-parallelly to the surface of the substrate, it is possible to obtain an oriented film having an ordered crystal orientation. By adopting a film structure of this kind, it is possible to obtain high piezoelectric characteristics.

Piezoelectric Device and Inkjet Recording Head

Figure 3:
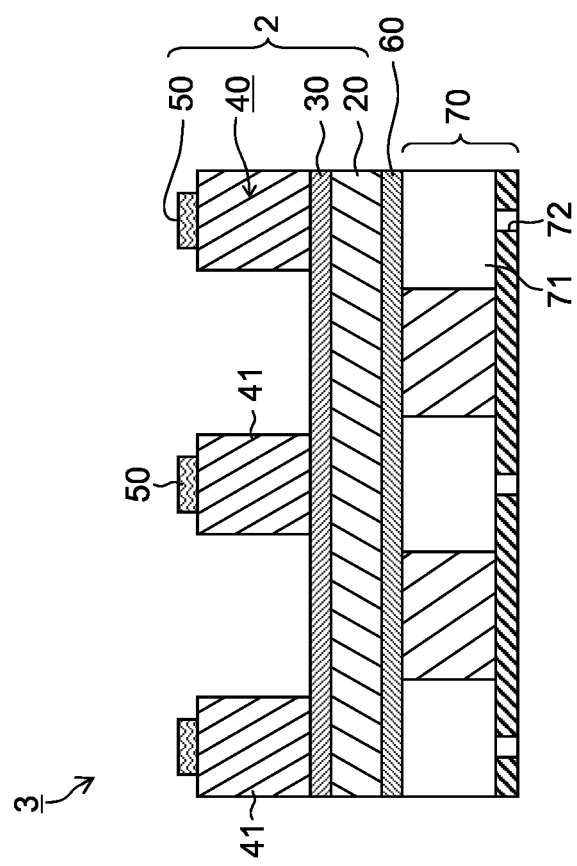
FIG. 3 is a cross-sectional diagram of the structure of a piezoelectric device and an inkjet recording apparatus.

A structure of a piezoelectric device according to an embodiment of the present invention and a structure of an inkjet recording head (a liquid ejection apparatus) having the piezoelectric device are described with reference to FIG. 3. FIG. 3 is a cross-sectional diagram showing substantial parts of the inkjet recording head. In order to facilitate visualization of the components of the inkjet recording head, the scales of the components in the drawing are made different appropriately to each other.

A piezoelectric device 2 according to the present embodiment is formed by sequentially placing a lower electrode 30, a piezoelectric film 40 and upper electrodes 50 on a substrate 20. An electric field is applied to the piezoelectric film 40 in the thickness direction thereof through the lower electrode 30 and each upper electrode 50. The piezoelectric film 40 is the piezoelectric film according to an embodiment of the present invention, which includes a perovskite oxide represented as the above-described general formula (P).

The lower electrode 30 is formed over substantially the whole surface of the substrate 20. The piezoelectric film 40 is formed on the lower electrode 30 and has a pattern of line-shaped projecting sections 41 arranged as stripes extending perpendicularly to the sheet of drawing in FIG. 3. The upper electrode 50 is formed on each projecting section 41.

The pattern of the piezoelectric film 40 is not limited to that shown in FIG. 3, and is designed as appropriate. Furthermore, the piezoelectric film 40 can be a continuous film. However, by forming the piezoelectric film 40 in the pattern having the projecting sections 41 which are mutually separated, rather than as a continuous film, the expansion and contraction of the respective projecting sections 41 is made smooth, which is desirable since a larger amount of displacement can be obtained.

There are no particular restrictions on the material of the substrate 20, and examples thereof include silicon, glass, stainless steel (SUS), yttria-stabilized zirconia (YSZ), alumina, sapphire, and silicon carbide. For the substrate 20, it is also possible to use a laminated substrate, such as an SOI substrate in which a $SiO_2$ oxide film is formed on the surface of a silicon substrate.

There are no particular restrictions on the major constituents of the lower electrode 30, and examples thereof include the metals or metal oxides such as Au, Pt, Ir, $IrO_2$, $RuO_2$, $LaNiO_3$, and $SrRuO_3$, and combinations thereof.

There are no particular restrictions on the major constituents of the upper electrodes 50, and examples thereof include the above-described examples of the major constituents of the lower electrode 30, electrode materials such as Al, Ta, Cr and Cu that are generally used in a semiconductor device, and combinations thereof.

There are no particular restrictions on the thicknesses of the lower electrode 30 and the upper electrodes 50, and each thickness can be approximately 200 nm, for instance. There are no particular restrictions on the thickness of the piezoelectric film 40, which is normally not smaller than 1 μm and can be in the range of 1 μm to 5 μm, for example. The thickness of the piezoelectric film 40 is desirably not smaller than 3 μm.

Schematically, the inkjet recording head (liquid ejection apparatus) 3 includes the above-described piezoelectric device 2 and an ink nozzle (liquid storing and ejecting member) 70 attached to a lower side of the piezoelectric device 2 in the drawing through a diaphragm 60. The ink nozzle 70 has ink chambers (liquid storing chambers) 71, which store ink, and ink ejection ports (liquid ejection ports) 72, through which the ink ejected from the ink chambers 71 to the outside. The ink chambers 71 are arranged in accordance with the number and pattern of the projecting sections 41 in the piezoelectric film 40.

In the inkjet recording head 3, the intensity of the electric field applied to each of the projecting sections 41 of the piezoelectric device 2 is changed so as to expand or contract each projecting section 41, and thereby the ejection timing and the ejection amount of the ink from the corresponding ink chamber 71 are controlled.

In place of attaching the diaphragm 60 and the ink nozzle 70 as the members independent from the substrate 20, a part of the substrate 20 can be processed into the diaphragm 60 and the ink nozzle 70. For example, if the substrate 20 is constituted of a layered substrate, such as an SOI substrate, then the substrate 20 can be etched, starting from the lower surface thereof in the drawing, in order to form the ink chambers 71, and then the diaphragm 60 and the ink nozzle 70 can be formed by processing the substrate 20 itself.

The piezoelectric device 2 and the inkjet recording head 3 according to the present embodiment have the composition described above.

Inkjet Recording Apparatus

Figure 4:
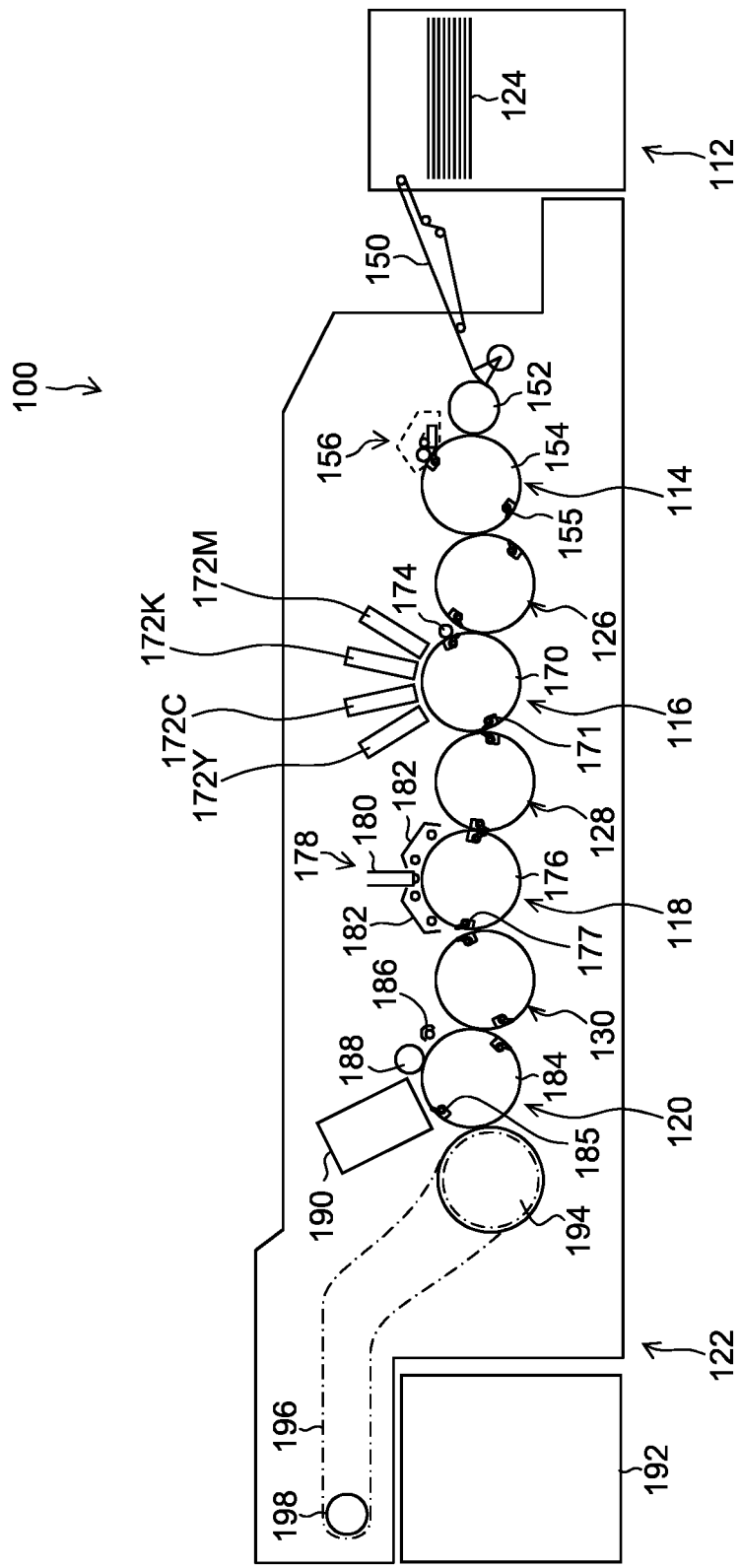
FIG. 4 is a schematic drawing showing a general view of an inkjet recording apparatus.

A configuration of an inkjet recording apparatus with the inkjet recording heads 3 (172M, 172K, 172C and 172Y) according to the embodiment of the present invention is described with reference to FIG. 4. FIG. 4 is a diagram showing the entire apparatus.

The inkjet recording apparatus 100 is of a direct-drawing type that forms a desired color image by depositing ink droplets of a plurality of colors from inkjet heads 172M, 172K, 172C and 172Y onto a recording medium 124 (often referred to as a "sheet" for convenience) that is held on a pressure drum (a drawing drum 170) of a drawing unit 116. The inkjet to recording apparatus 100 is an on-demand type image forming apparatus employing a two-liquid reaction (aggregation) system for applying treatment liquid (aggregation treatment liquid) to the recording medium 124 prior to depositing the ink droplets, and then making the treatment liquid react with the ink droplets to form an image on the recording medium 124.

As shown in FIG. 4, the inkjet recording apparatus 100 mainly has a sheet feeding unit 112, a treatment liquid application unit 114, the drawing unit 116, a drying unit 118, a fixing unit 120, and a discharge unit 122.

<Sheet Feeding Unit>

The sheet feeding unit 112 is a mechanism for supplying the recording media 124 to the treatment liquid application unit 114. The recording media 124, sheets of paper, are stacked on the sheet feeding unit 112. The sheet feeding unit 112 is provided with a sheet tray 150 from which the recording media 124 are supplied, one by one, to the treatment liquid application unit 114.

<Treatment Liquid Application Unit>

The treatment liquid application unit 114 is a mechanism for applying the treatment liquid to a recording surface of the recording medium 124. The treatment liquid contains a color material aggregating agent for aggregating color materials (pigments in the present embodiment) of the ink deposited by the drawing unit 116. Contact between the treatment liquid and the ink facilitates separation of the ink into the color materials and solvent.

The recording medium 124, applied with the treatment liquid in the treatment liquid application unit 114, is delivered from the treatment liquid drum 154 to the drawing drum 170 of the drawing unit 116 through an intermediate conveying unit 126.

<Drawing Unit>

The drawing unit 116 has the drawing drum (the second conveying body) 170, a sheet pressing roller 174, and the inkjet recording heads 172M, 172K, 172C and 172Y.

Each of the inkjet recording heads 172M, 172K, 172C and 172Y is preferably a full-line type inkjet recording head (inkjet head), the length of which corresponds to the maximum width of an image forming region on the recording medium 124. An ink ejection surface of each of the inkjet recording heads 172M, 172K, 172C and 172Y has a nozzle row in which a plurality of ink ejection nozzles are arranged over the entire width of the image forming region. Each of the inkjet recording heads 172M, 172K, 172C and 172Y is installed so as to extend in a direction perpendicular to a conveyance direction of the recording medium 124 (a rotation direction of the drawing drum 170).

The inkjet recording heads 172M, 172K, 172C and 172Y eject ink droplets of the corresponding colors to the recording surface of the recording medium 124 tightly held on the drawing drum 170. As a result, the ink droplets come into contact with the treatment liquid that has been applied to the recording surface in the treatment liquid application unit 114, and consequently the color materials (pigments) dispersed within the ink are aggregated, forming a color material aggregate. This prevents the color materials from flowing on the recording medium 124, and an image is formed on the recording surface of the recording medium 124.

The recording medium 124 on which the image has been formed in the drawing unit 116 is then delivered from the drawing drum 170 to a drying drum 176 of the drying unit 118 through an intermediate conveying unit 128.

<Drying Unit>

The drying unit 118 is a mechanism for drying the moisture contained in the solvent separated by the color material aggregating action. As shown in FIG. 3, the drying unit 118 has the drying drum (conveying body) 176 and a solvent drying device 178.

The solvent drying device 178, disposed so as to face an outer circumference of the drying drum 176, is constituted of IR (infrared) heaters 182 and a warm air jet nozzle 180 disposed between the IR heaters 182.

The recording medium 124 that has been subjected to the drying process in the drying unit 118 is delivered from the drying drum 176 to a fixing drum 184 of the fixing unit 120 through an intermediate conveying unit 130.

<Fixing Unit>

The fixing unit 120 is constituted of the fixing drum 184, a halogen heater 186, a fixing roller 188, and an in-line sensor 190. When the fixing drum 184 rotates, the recording medium 124 is conveyed with its recording surface facing outward, and the recording surface is then preheated by the halogen heater 186, fixed by the fixing roller 188, and inspected by the in-line sensor 190.

The fixing roller 188 is a roller member that adheres self-dispersible thermoplastic resin particles in the dried ink to each other by applying heat and pressure to the dried ink, in order to form the ink into a film. The fixing roller 188 is configured to apply heat and pressure to the recording medium 124.

According to the fixing unit 120 having the composition described above, the thermoplastic resin particles in the thin image layer formed by the drying unit 118 are heated, pressed and melted by the fixing roller 188, and hence the image layer can be fixed to the recording medium 124.

Moreover, in cases where the ink contains ultraviolet-curable monomer, it possible to improve the strength of the image by irradiating ultraviolet light onto the image in a fixing unit having an ultraviolet irradiation lamp, after the water has been evaporated off sufficiently in the drying unit, thereby curing and polymerizing the ultraviolet-curable monomer.

<Discharge Unit>

The discharge unit 122 is arranged following the fixing unit 120. The discharge unit 122 has a discharge tray 192. Between the discharge tray 192 and the fixing drum 184 of the fixing unit 120 there are arranged a delivery drum 194, conveying belt 196, and stretching roller 198 so as to face the discharge tray 192 and the fixing drum 184. The recording medium 124 is fed to the conveying belt 196 by the delivery drum 194 and then discharged to the discharge tray 192.

Although FIG. 4 illustrates the drum conveyance type inkjet recording apparatus, the present invention is not limited thereto and can also be used in a belt conveyance type inkjet recording apparatus and the like.

EXAMPLES

The present invention is described in further detail using examples below; however, the present invention is not limited thereto.

Practical Example 1

A diaphragm structure was manufactured by processing an SOI substrate by silicon RIE etching, and a 50 nm-thick TiW film and a 150 nm-thick Ir lower electrode were successively deposited on the diaphragm structure by sputtering at a substrate temperature of 350° C. A 4 μm-thick PZT piezoelectric film was deposited on this lower electrode. The film forming conditions were as described below.
Film formation apparatus: an Rf sputtering apparatus;
Target: a sintered body of $Pb_{1.3}(Zr_{0.44}Ti_{0.40}Nb_{0.12}Mg_{0.04})O_3$ having the diameter of 120 mm;
Substrate temperature: 475° C.;
Substrate to target distance (T-S distance): 60 mm;
Film formation pressure: 0.3 Pa (2.3 mTorr);
Film formation gas: $Ar/O_2=97.5/2.5$ (in molar ratio); and
Input power: 500 W.

The piezoelectric film thus obtained had a columnar structure constituted of many columnar bodies extending in a non-parallel direction with respect to the substrate surface, and was confirmed to be a (100) oriented film having the perovskite structure by X-ray diffraction (XRD) analysis. Nb component and Mg component at the B site were measured to be 13% and 3.5%, respectively, by X-ray fluorescence (XRF) analysis. The surface roughness Ra was calculated by AFM measurement, and the stress applied to the thin film was calculated from the amount of warping of the wafer as measured by a non-contact step meter WYCO. The Ra value was measured to be 9 nm, and the tensile stress applied to the film was measured to be 170 MPa. An upper electrode was formed on the piezoelectric film by a lithography process, and the piezoelectric constant $d_{31}$ was measured to be 195 pm/V from the amount of displacement of the diaphragm.

Comparative Example 4

In Comparative Example 4, the target was changed to a sintered body of $Pb_{1.3}(Zr_{0.42}Ti_{0.39}Nb_{0.12}Mg_{0.07})O_3$ having the diameter of 120 mm, apart from which the film formation was performed under the same conditions to those of Practical Example 1.

The piezoelectric film thus obtained had a columnar structure constituted of many columnar bodies extending in a non-parallel direction with respect to the substrate surface, and was confirmed to be a (100) oriented film having the perovskite structure by X-ray diffraction (XRD) analysis. The Nb component and the Mg component at the B site were measured to be 13% and 6.5%, respectively, by X-ray fluorescence (XRF) analysis. The Ra value was measured to be 11 nm, the tensile stress applied to the film was measured to be 180 MPa, and the piezoelectric constant $d_{31}$ was measured to be 140 pm/V. However, after the lithography process for forming the upper electrode, cracks occurred in approximately 50% of the surface area of the piezoelectric film, and the production yield deteriorated markedly.

Practical Examples 2 to 5, and Comparative Examples 1 to 3 and 5 to 8

In each of Practical Examples 2 to 5 and Comparative Examples 1 to 3 and 5 to 8, the target was changed to the target shown in FIG. 5, apart from which the film formation was performed under the same conditions to those of Practical Example 1.

FIG. 5 shows the corresponding targets and the results, in which the symbols relating to cracking represent evaluations based on the following criteria, made by checking the surface of the piezoelectric film with a microscope having a 5× magnifying power:
A: cracks not observed, or in no more than 20% of the whole of the piezoelectric film;
B: cracks exceeding 20% and no more than 50% in the whole of the piezoelectric film; and
C: cracks exceeding 50% of the whole of the piezoelectric film.

Referring to FIG. 5, in experiments where b exceeded 0.3, cracks occurred in the surface of the piezoelectric film and it was not possible to form a good sample.

There was a reduction in the piezoelectric constant $d_{31}$ due to doping with Mg, but not of a level to cause a problem. Moreover, it was confirmed that doping with Mg also reduced the surface roughness Ra and improved the smoothness of the surface.

Figure 6:
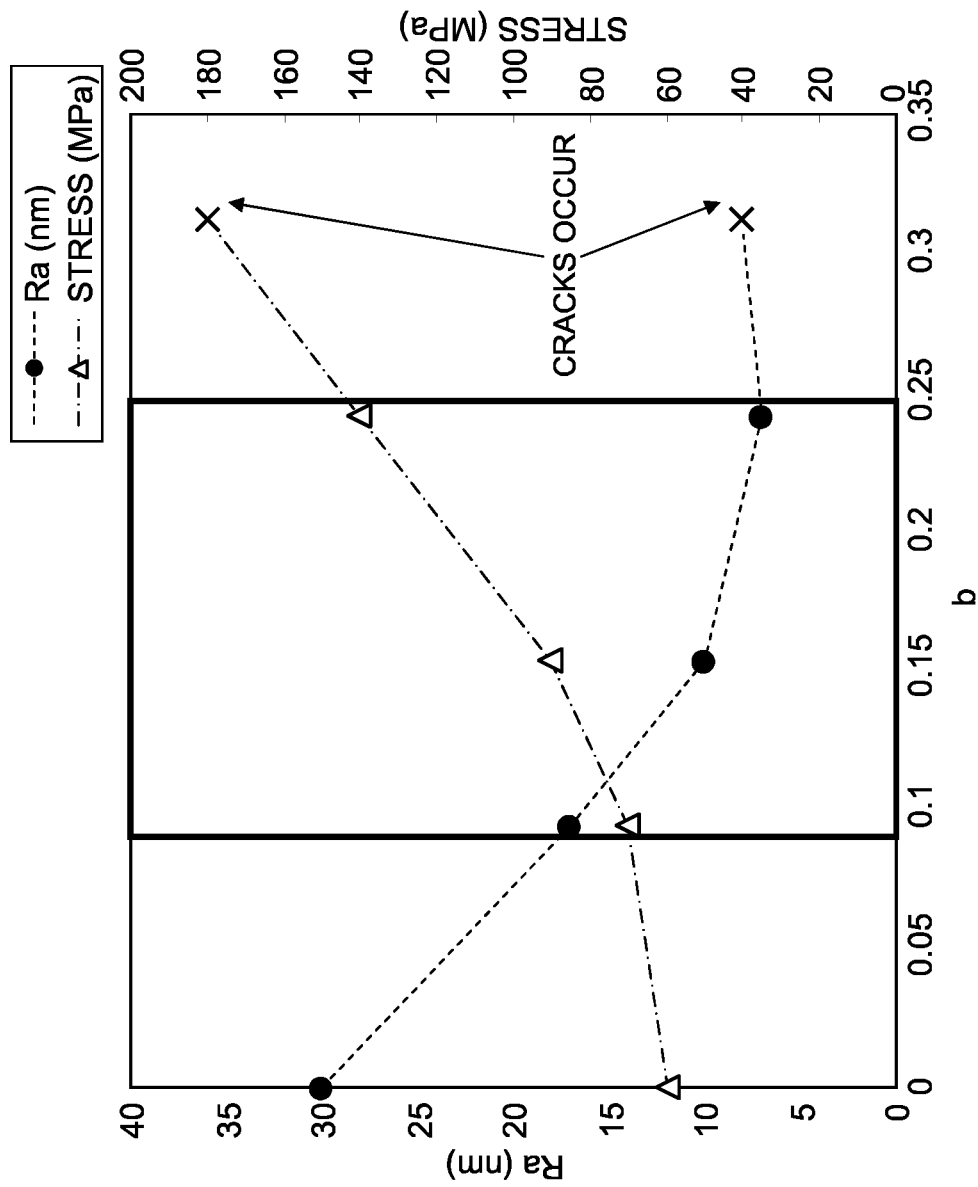
FIG. 6 is a diagram showing the relationship of the amount of Mg to the surface roughness Ra and the stress when the amount of Nb was 22%.

FIG. 6 shows the relationship of a Mg component to the surface roughness Ra and the stress when a Nb component was 22% (Practical Examples 3 to 5, and Comparative Examples 7 and 8). As shown in FIG. 6, the surface roughness Ra became smaller, whereas the stress, conversely, became larger, as the amount of Mg in the composition became larger, and cracks occurred in the vicinity of the composition ratio in the related art (b=0.33). From Practical Examples and FIG. 6, by setting the b value to a range of 0.090≤b≤0.25, which is surrounded by the thick line in FIG. 6, the surface properties are improved, and it is possible to provide a piezoelectric device having a suitable stress.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A piezoelectric film constituted of a perovskite oxide represented as:

$$Pb_{1+\delta}(Zr_xTi_y)_{1-a}(Mg_bNb_{1-b})_aO_z,\quad (P)$$

where δ=0, z=3, b is a value in a range of 0.090≤b≤0.25, a Nb ratio at a B site satisfies 0.13≤a×(1−b), a ratio x:y, which is a ratio between Zr and Ti at a B site, is in a range of 45:55 to 55:45, and a ratio b:(1−b), which is a ratio between Mg and Nb at a B site, is in a range of 1:3 to 1:10.

2. The piezoelectric film as defined in claim 1, wherein the Nb ratio at the B site satisfies 0.16≤a×(1−b).

3. The piezoelectric film as defined in claim 1, wherein the piezoelectric film is formed by a vapor phase deposition method.

4. A piezoelectric device, comprising:
the piezoelectric film as defined in claim 1;
electrodes through which an electric field is applied to the piezoelectric film; and
a substrate on which the piezoelectric film and the electrodes are arranged, the substrate being one of a silicon substrate, a silicon oxide substrate and an SOI substrate.

5. A method of manufacturing the piezoelectric film as defined in claim 1, the method comprising the step of performing formation of the piezoelectric film by a vapor phase deposition method.

6. The piezoelectric film as defined in claim 1, wherein in the general formula (P), b is a value in a range of 0.15≤b≤0.25.

7. The piezoelectric film as defined in claim 3, wherein the vapor phase deposition method is a sputtering method.

8. A liquid ejection apparatus, comprising:
the piezoelectric device as defined in claim 4; and
a liquid ejection member which is arranged integrally with or separately from the piezoelectric device,
wherein the liquid ejection member includes a liquid storage chamber in which liquid is stored, and a liquid ejection port through which the liquid is ejected externally from the liquid storage chamber.

9. The method as defined in claim 5, wherein the vapor phase deposition method is a sputtering method.

10. The method as defined in claim 9, further comprising the step of:

arranging a substrate and a target separately from each other, the target having a composition corresponding to a composition of the piezoelectric film to be formed on the substrate, wherein in the step of performing formation of the piezoelectric film, a film formation temperature Ts (° C.), and a potential difference Vs–Vf (V) between a plasma potential Vs (V) and a floating potential Vf (V) in a plasma during the formation of the piezoelectric film satisfy:

$Ts \geq 400$; and $-0.2Ts+100 < Vs-Vf < -0.2Ts+130$.

* * * * *